United States Patent [19]

Stadler et al.

[11] Patent Number: 5,587,046

[45] Date of Patent: Dec. 24, 1996

[54] PROCESS FOR TREATING SEMICONDUCTOR MATERIAL WITH AN ACID-CONTAINING FLUID

[75] Inventors: Maximilian Stadler, Haiming; Günter Schwab, Emmerting; Peter Romeder, Burghausen; Gabriele Trifellner, Winhoring, all of Germany

[73] Assignee: Wacker Siltronic Gesellschaft Für Halbleitermaterialien Aktiengesellschaft, Burghausen, Germany

[21] Appl. No.: 419,362

[22] Filed: Apr. 10, 1995

[30] Foreign Application Priority Data

Apr. 28, 1994 [DE] Germany .......................... 44 14 925.5

[51] Int. Cl.$^6$ ...................................................... H01L 21/00
[52] U.S. Cl. ....................... 156/662.1; 252/79.2; 252/79.3
[58] Field of Search ................................ 252/79.2, 79.4, 252/79.3; 156/662.1, 657.1; 216/2, 99

[56] References Cited

U.S. PATENT DOCUMENTS 3,923,567  12/1975  Lawrence .......................... 252/79.3 X
3,971,683   7/1976  Briska et al. ....................... 252/79.2 X

FOREIGN PATENT DOCUMENTS 2273081  12/1975  France .

OTHER PUBLICATIONS

Patent Abstracts of Japan JP-A-55154452.
Derwent Abstract of JP-A-55154452.

*Primary Examiner*—William Powell
*Attorney, Agent, or Firm*—Collard & Roe, P.C.

[57] ABSTRACT

A process for treating semiconductor material with an acid-containing fluid, has water being formed as a product of a chemical reaction. Before and/or during the treatment of the semiconductor material, phosphorus pentoxide is added to the acid-containing fluid.

10 Claims, No Drawings

PROCESS FOR TREATING SEMICONDUCTOR MATERIAL WITH AN ACID-CONTAINING FLUID

BACKGROUND OF THE INVENTION

1. Field of the Invention

The present invention relates to a process for treating semiconductor material with an acid-containing fluid with the formation of water as a product of a chemical reaction.

2. The Prior Art

The provision of suitable base materials from which electronic components can be fabricated, regularly requires process steps during which semiconductor material has to be treated with acid-containing fluids. Such treatments may have various objectives. They are employed, for example, to analyze the crystal structure of the semiconductor material or to uncover imperfections in the crystal. They also serve to detach impurities from the surface of the semiconductor material or to remove layers close to the surface, whose crystal structure has been disturbed due to mechanical action. A further objective of treating semiconductor material with acid-containing fluids is the provision of semiconductor wafers having lateral surfaces which have been etched completely smooth.

Achieving these objectives requires that the acid-containing fluid employed be able to chemically dissolve the semiconductor material in question. As a rule, water is formed, inter alia, during this process as a product of a chemical reaction. The water produced accumulates in the acid-containing fluid and affects the further progress of the treatment of the semiconductor material. Frequently, the rate of removal of material is reduced, so that longer treatment times are incurred or the treatment fluid employed has to be replaced sooner, production costs being raised in either case. An increasing water content in the acid-containing fluid may also have an adverse effect on the result of the treatment of semiconductor wafers. If, for example, the lateral surfaces of silicon wafers are examined which had been treated with a fluid containing hydrofluoric acid and nitric acid, it is found that the residual roughness of the surfaces correlates with the water content in the treatment medium. Where the water content was higher, other conditions being equal, the residual roughness of the lateral surfaces of the silicon wafers is likewise higher.

SUMMARY OF THE INVENTION

It is an object of the present invention to provide a process by which the prior art drawbacks can be overcome.

The object is achieved according to the present invention by providing a process for treating semiconductor material with an acid-containing fluid, water being formed as a product of a chemical reaction, which comprises adding phosphorus pentoxide to the acid-containing fluid. This can be done before and/or during the treatment of the semiconductor material.

The term "treatment of semiconductor material" within the scope of the invention is to be understood as bringing semiconductor material and acid-containing fluid into contact. This can be effected, in particular, by the semiconductor material being dipped into the acid-containing fluid or being sprayed therewith.

As a rule, a specific, though low water content in the acid-containing fluid (hereinafter referred to as "etchant") is desirable and necessary, in order for the semiconductor material to be etched at a satisfactory rate. Consequently, a water content in the etchant of at most 20% by weight is quite acceptable. The addition of phosphorus pentoxide to the etchant firstly ensures that the water content during the treatment of the semiconductor material does not rise above the level of 20% by weight. Secondly, it has been found that the phosphoric acid produced by the chemical reaction of water and phosphorus pentoxide has beneficial effect on the flow behavior of the etchant and contributes to an enhancement of its surface-smoothing action.

Furthermore, it is often expedient, when making up the etchant, not to use concentrated acids, but instead their more easily handled aqueous solutions. In such cases, the water content in the etchant is brought to the desired value by the addition of phosphorus pentoxide before the treatment of the semiconductor material. Said value may also be below the value which can be achieved by mixing the individual components lowest in water. During the treatment of the semiconductor material, the addition of phosphorus pentoxide may be carried out batchwise or continuously. Advantageously, at least that amount of phosphorus pentoxide is added to the etchant, which is required to bind the amount of water produced during the treatment of the semiconductor material. The addition should take place in such a way that it does not interfere with the treatment of the semiconductor material. Interference would be constituted, for example, by added phosphorus pentoxide settling on the semiconductor material. This can be prevented, for example, by a portion of the etchant being shunted off briefly and phosphorus pentoxide being admixed, with the formation of phosphoric acid. This mixture is then added to the etchant portion remaining for the treatment of semiconductor material.

The process can be applied to any acid-containing fluids which attack semiconductor material with the formation of water. Preference is given to etchants low in water, which contain hydrofluoric acid and at least one agent which is able to oxidize the semiconductor material to be treated. Particular preference is given to etchants low in water, which are based on hydrofluoric acid and nitric acid. The etchant may optionally contain one or more further components preferably selected from a group of substances which comprises acetic acid, aqueous ammonium fluoride solutions, sulfuric acid, hydrochloric acid, and phosphoric acid.

The addition of phosphorus pentoxide to the etchant is particularly suitable for the wet-chemical treatment of silicon. The process can, however, also be used advantageously for the treatment of other element semiconductors such as germanium or compound semiconductors such as gallium arsenide. The advantages of the process become apparent in particular, with the etching of silicon wafers, known as "chemical polishing". The addition of phosphorus pentoxide to the etchant distinctly improves the geometry of the etched wafers and the smoothness of their lateral surfaces. In addition, the invention, in the case of the treatment of wafers, fragments, granules and other shaped articles composed of semiconductor material, is distinguished by making it possible to extend the service periods of the etchant, increase plant capacities and reduce costs of auxiliaries.

While several embodiments of the present invention have been shown and described, it is to be understood that many changes and modifications may be made thereunto without departing from the spirit and scope of the invention as defined in the appended claims.

What is claimed is:

1. A process for treating semiconductor material with an acid-containing fluid, water being formed as the product of a chemical reaction, which comprises treating with an acid-containing fluid comprising water hydrofluoric acid and an oxidizing agent; and adding phosphorus pentoxide to the acid-containing fluid.

2. The process as claimed in claim 1, comprising adding said phosphorus pentoxide before the treatment of the semiconductor material.

3. A process for treating semiconductor material with an acid-containing fluid, water being formed as the product of a chemical reaction, which comprises adding phosphorus pentoxide to the acid-containing fluid during the treatment of the semiconductor material.

4. The process as claimed in claim 3, comprising adding said phosphorus pentoxide continuously.

5. The process as claimed in claim 3, comprising adding said phosphorous pentoxide batchwise.

6. The process as claimed in claim 1, comprising adding said phosphorus pentoxide so as to maintain the water content in the acid-containing fluid below 20% by weight.

7. The process as claimed in claim 1, wherein said acid-containing fluid further comprises a component selected from the group consisting of acetic acid, aqueous ammonium fluoride solution, sulfuric acid, hydrochloric acid, phosphoric acid, and the mixtures thereof.

8. The process as claimed in claim 1, wherein the semiconductor material is silicon.

9. The process as claimed in claim 1, wherein the semiconductor material is germanium.

10. The process as claimed in claim 1, wherein the semiconductor material is gallium arsenide.

* * * * *